(12) United States Patent
Marr

(10) Patent No.: US 7,425,472 B2
(45) Date of Patent: Sep. 16, 2008

(54) SEMICONDUCTOR FUSES AND SEMICONDUCTOR DEVICES CONTAINING THE SAME

(75) Inventor: Kenneth W. Marr, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/082,066

(22) Filed: Mar. 16, 2005

(65) Prior Publication Data

US 2005/0158919 A1    Jul. 21, 2005

Related U.S. Application Data

(62) Division of application No. 10/227,333, filed on Aug. 23, 2002.

(51) Int. Cl.
*H01L 21/82* (2006.01)
(52) U.S. Cl. .................................. 438/132; 438/601
(58) Field of Classification Search ......... 438/128–132, 438/601
See application file for complete search history.

(56) References Cited

U.S. PATENT DOCUMENTS

| | | | |
|---|---|---|---|
| 3,783,506 A | 1/1974 | Rehfeld |
| 4,135,295 A | 1/1979 | Price |
| 4,441,167 A | 4/1984 | Principi |
| 4,491,860 A | 1/1985 | Lim |
| 4,617,723 A | 10/1986 | Mukai |
| 4,647,340 A | 3/1987 | Szluk et al. |
| 4,670,970 A | 6/1987 | Bajor |
| 4,679,310 A | 7/1987 | Ramachandra et al. |
| 4,747,076 A | 5/1988 | Mukai |
| 4,873,506 A | 10/1989 | Gurevich |
| 5,185,291 A | 2/1993 | Fischer et al. |
| 5,231,056 A | 7/1993 | Sandhu |
| 5,240,739 A | 8/1993 | Doan et al. |
| 5,242,859 A | 9/1993 | Degelormo et al. |
| 5,264,725 A | 11/1993 | Mullarkey et al. |
| 5,278,100 A | 1/1994 | Doan et al. |
| 5,376,405 A | 12/1994 | Doan et al. |
| 5,578,517 A | 11/1996 | Yoo et al. |
| 5,585,662 A | 12/1996 | Ogawa |
| 5,618,750 A | 4/1997 | Fukuhara et al. |
| 5,652,175 A | 7/1997 | Chen et al. |

(Continued)

FOREIGN PATENT DOCUMENTS

JP    56085846 A    7/1981

(Continued)

*Primary Examiner*—H. Jey Tsai
(74) *Attorney, Agent, or Firm*—TraskBritt

(57) ABSTRACT

A fuse for use in a semiconductor device includes spaced-apart terminals with at least two layers of conductive material and a single-layer conductive link joining the spaced-apart terminals and including a single layer of conductive material. A first, lower layer of the terminals of each fuse may be formed from conductively doped polysilicon. The second, upper layer of each fuse terminal may be formed from a polycide, a metal silicide, a metal, or a conductive alloy. The conductive link of each fuse may be formed from either the material of the first layer or the material of the second layer. Methods for fabricating the fuse include forming the first and second layers and patterning the first and second layers so as to form a fuse with the desired structure.

12 Claims, 8 Drawing Sheets

U.S. PATENT DOCUMENTS

| | | |
|---|---|---|
| 5,661,323 A | 8/1997 | Choi et al. |
| 5,698,456 A | 12/1997 | Bryant et al. |
| 5,712,206 A | 1/1998 | Chen |
| 5,814,876 A | 9/1998 | Peyre-Lavigne et al. |
| 5,827,759 A | 10/1998 | Froehner |
| 5,882,998 A | 3/1999 | Sur, Jr. et al. |
| 5,917,229 A | 6/1999 | Nathan et al. |
| 5,936,296 A | 8/1999 | Park et al. |
| 5,969,404 A | 10/1999 | Bohr et al. |
| 5,976,943 A * | 11/1999 | Manley et al. ............ 438/382 |
| 6,069,055 A | 5/2000 | Ukeda et al. |
| 6,166,421 A | 12/2000 | Kalnitsky et al. |
| 6,294,453 B1 | 9/2001 | Marmillion et al. |
| 6,372,652 B1 | 4/2002 | Verma et al. |
| 6,501,107 B1 | 12/2002 | Sinclair et al. |
| 6,642,601 B2 * | 11/2003 | Marshall et al. ............ 257/529 |
| 2001/0017755 A1 | 8/2001 | Toyoshima |
| 2002/0185738 A1 | 12/2002 | Kim et al. |
| 2003/0123207 A1 | 7/2003 | Toyoshima |

FOREIGN PATENT DOCUMENTS

| | | |
|---|---|---|
| JP | 357139958 A | 8/1982 |
| JP | 59154038 A | 9/1984 |
| JP | 60261154 A | 12/1985 |
| JP | 363161641 A | 7/1988 |
| JP | 03052254 A | 3/1991 |

* cited by examiner

SEMICONDUCTOR FUSES AND SEMICONDUCTOR DEVICES CONTAINING THE SAME

CROSS-REFERENCE TO RELATED APPLICATIONS

This application is a divisional of application Ser. No. 10/227,333, filed Aug. 23, 2002, pending, which is related to application Ser. No. 09/277,893, filed Mar. 29, 1999, pending.

BACKGROUND OF THE INVENTION

1. Field of the Invention

The present invention relates generally to fusible elements, or fuses of semiconductor device structures, to semiconductor device structures that include fuses, and to methods of fabricating and using the fuses. In particular, the present invention relates to fuses that include metal silicide fuse layers and to methods for fabricating such fuses.

2. Background of Related Art

Computers typically include various types of memory devices. One type of memory device that is typically included in a computer is a read-only memory ("ROM") device in which data is permanently stored. The programming of a ROM device typically cannot be overwritten or otherwise altered. Thus, ROM devices are useful whenever unalterable data or instructions are desired or required. ROM devices are also nonvolatile devices, meaning that the data stored therein is not destroyed when power to these devices is shut off.

ROM devices are typically designed to execute a specific program and, thus, programmed during fabrication thereof. Typically, the programming of a ROM device is effected by forming permanent electrical connections at selected locations of the memory device, or by "wiring" the memory device in a specific way. As a result, the programming of ROM devices, somewhat undesirably, typically cannot be changed. If a new program is desired, the ROM must be configured or "wired" with the new program.

Another type of memory device that may be used in a computer is the so-called programmable read-only memory ("PROM") device. Unlike ROM devices, a PROM device may be programmed following fabrication. Some PROM devices are provided with an electrical connection in the form of a fusible link, which is also known in the art to render them programmable as a fuse.

U.S. Pat. Nos. 5,264,725; 4,670,970; 5,661,323; 5,652,175; 5,618,750; 5,578,517; and 3,783,506 disclose exemplary types of fuses that may be used in PROM devices. One type of conventional fuse includes a conductive, metal or polysilicon layer with a narrowed or "necked down" region that forms a conductive link between two wider or otherwise more massive regions of the fuse. This type of fuse may be rendered discontinuous to an electrical current, or "blown" by forcing or driving a relatively high current through the conductive, metal or polysilicon layer. Due to the electrical resistance inherent in the narrowed region, the driving current heats the metal or polysilicon that forms the narrowed region to a temperature above the melting point of the metal or polysilicon, thereby breaking the conductive link of the fuse. Fuses usually blow at the narrowed regions thereof since the current densities and temperatures are highest in that less massive region. Each fuse of a PROM device is thus programmed to one of a pair of conductivity or voltage patterns (i.e., blown or unblown), which corresponds to a bit designated as either a "1" or a "0", which is the data stored in a particular cell of the memory device associated with the fuse. A PROM device is programmed by selectively blowing fuses along a predetermined sequence, or path.

Fuses may also be used in other types of semiconductor devices, such as static random access memory ("SRAM") devices and dynamic random access memory ("DRAM") devices. For example, fuses are useful in SRAM and DRAM devices to select memory circuits that will be used in the finished device (e.g., if a primary circuit is not useful or does not meet quality requirements, that circuit may be deselected and a redundant circuit activated by blowing one or more fuses). The use of fuses in this manner thus improves the fabrication yield of high-density memory devices.

As an alternative to blowing fuses with an electrical current, a laser can be used to blow selected fuses. As memory devices decrease in size and the degree or density of integration increases, the critical dimensions (e.g., fuse pitch) of memory cells become smaller. The availability of lasers suitable to blow fuses is limited since the diameter of the laser beam should not be larger than the fuse pitch. Thus, when lasers are the desired means of programming fuses, the fuse pitch and, therefore, the size of the memory device are dictated by the minimum diameter of laser beams obtainable by current laser technology. Currently, the lower limit of beam diameters for some laser beams is about 5 microns. Using electrical currents instead to blow fuses, therefore, has a greater potential for high-degree integration and decreased size of memory devices. The use of lasers to blow fuses is, therefore, becoming increasingly difficult. Programmable fuses may also be used to address a variety of applications in numerous other types of semiconductor devices.

The metal and polysilicon fuses that are currently used in semiconductor devices are typically "blown" with a laser rather than with an electrical current. The amount of current or laser beam intensity that may be required to "blow" conventional metal or polysilicon fuses may damage regions and structures of the semiconductor device that are proximate to the fuse.

Accordingly, there is a need for semiconductor device fuses that may be programmed, or blown, to impart the fuse with a significantly different conductivity than that of an intact fuse without significantly affecting surrounding structures.

SUMMARY OF THE INVENTION

The present invention includes a fuse that is useful in a semiconductor device, as well as semiconductor devices that include the fuse. The fuse of the present invention may be disposed over an insulative structure, such as an oxide layer (e.g., a field oxide or other field isolation region) of a semiconductor device. The fuse of the present invention may comprise an elongated structure that includes two terminal regions disposed on either side of a less massive or narrower conductive central region, which is also referred to herein as a "conductive link." The terminal regions of the fuse may include two conductive layers, which may communicate with conductive structures or conductively doped regions of the substrate of the semiconductor device. The central region of the fuse may include a thinner (e.g., single) layer of conductive material. Thus, the central region of the fuse may exhibit a smaller transverse cross-sectional area taken along at least a portion of the length thereof and, thus, have a lesser conductive material mass or volume than either of the terminal ends.

By way of example only, a fuse according to the present invention may be formed on an insulative layer or structure, such as a field isolation region (e.g., a field oxide) formed between active device regions of a semiconductor substrate.

The lowermost conductive layer of the fuse may be formed from polysilicon, which may be disposed on a semiconductor device structure in discrete regions thereof. The inventive fuse may be employed in a circuit of a semiconductor device, either alone or in association with a gate structure of a transistor. An upper conductive layer of the fuse may be fabricated from a metal silicide (e.g., tungsten silicide, titanium silicide, tantalum silicide, molybdenum silicide, cobalt silicide, nickel silicide, platinum silicide, lead silicide, etc.) or a polycide (a deposited metal silicide).

The present invention also includes methods for fabricating fuses for use in semiconductor devices. Fuses incorporating teachings of the present invention may be fabricated substantially concurrently with the fabrication of a transistor gate structure of the semiconductor device.

In an exemplary embodiment of a method for fabricating a fuse of the present invention, a first layer that includes conductive material (e.g., conductively doped polysilicon) is formed over a semiconductor device structure. At regions where fuses are to be located, the first layer of conductive material may be patterned to define at least two discrete, spaced-apart regions. Accordingly, underlying portions of the semiconductor device structure upon which the fuse is being fabricated are exposed between the at least two spaced-apart regions of the layer of conductive material.

A second conductive layer, which may comprise a metal silicide, a polycide, or a metal if the first layer comprises polysilicon, may be formed over the semiconductor device structure, including over the remaining portions of the patterned first conductive layer. If the second layer comprises metal, at least a portion of the metal layer may be annealed to underlying polysilicon, as known in the art, to form a metal silicide or polycide.

The second conductive layer may be patterned to define, at each fuse location, terminal regions over the spaced-apart regions of the first conductive layer and a preferably narrower central region, or "conductive link," that joins the terminal regions. Preferably, the combined conductive material volume of each terminal region of the fuse exceeds the conductive material volume of the central region of the fuse.

An outer periphery of the fuse may be defined by patterning the first and second conductive layers with a single mask. Optionally, the conductive layers of a transistor gate may be patterned using the same mask.

Another exemplary embodiment of a fuse includes a lower layer of conductive material, such as polysilicon, and an upper layer comprising metal silicide. The fuse includes a central region, or conductive link, that has a smaller mass than the terminal regions at either end thereof. The conductive link is formed from the lower layer of conductive material, while each terminal includes both the lower and upper layers of conductive material.

A method for fabricating such a fuse in accordance with teachings of the present invention includes forming a first layer including conductive material over the semiconductor device structure, forming a second layer that includes conductive material over the first layer, and patterning the first and second layers to form the fuse. The first and second layers may also be patterned to form the conductive layers of a transistor gate stack.

The first layer may be formed by depositing a conductive material onto an exposed surface of a semiconductor device structure. For example, the first layer may be formed by depositing polysilicon onto the surface of the semiconductor device structure. A conductive dopant may be deposited concurrently with the polysilicon or the dopant may be implanted into a previously formed layer including polysilicon, thus rendering the polysilicon conductive.

The second layer may be formed by depositing a layer comprising a conductive material, such as a metal silicide, a polycide, or, if the first layer comprises polysilicon, a metal, over the first layer. If the first and second layers respectively comprise polysilicon and metal, these layers may be at least partially annealed, as known in the art, to form a metal silicide or polycide.

Once the first and second layers have been formed, the second layer may be patterned, as known in the art (e.g., by use of a mask and suitable etchant or combination of etchants), to reduce the thickness thereof at the area where the central region is to be located. The etchant or combination of etchants that removes the material or materials of the second layer may do so with selectivity over the material or materials of the first layer. The use of a selective etchant or etchant combination prevents the undesired removal of conductive material of the first layer from the location at which the conductive link of each fuse will be subsequently defined.

Additionally, the first and second layers may be patterned by known processes (e.g., by use of a mask and a suitable etchant or etchants) to define the outer periphery of each fuse, including the terminal regions and the central region thereof. Of course, since the second layer of conductive material does not extend across the central region, or conductive link, of the fuse, the second layer may be separately patterned either before or after the first and second layers are patterned to form the outer periphery of the fuse. In either case, such patterning of the second layer may be effected to form discrete, spaced-apart regions of the second layer.

By providing a fuse with terminal regions of greater mass or volume than the central region of the fuse, the fuse may "blow" at the central region thereof when a programming current is applied to the fuse, thereby yielding an open circuit across the length of the fuse. The open circuit results as the central region of the fuse melts or otherwise becomes discontinuous and will, therefore, no longer conduct a significant electrical current between the terminal regions of the fuse.

Other features and advantages of the present invention will become apparent to those of ordinary skill in the art through a consideration of the ensuing description, the accompanying drawings, and the appended claims.

BRIEF DESCRIPTION OF THE SEVERAL VIEWS OF THE DRAWINGS

The figures presented in conjunction with this description are not actual views of any particular portion of an actual semiconductor device or component, but are merely schematic representations employed to more clearly and fully depict exemplary embodiments of the present invention.

FIGS. 2-6 illustrate the substantially concurrent fabrication of the fuse and a transistor gate structure;

DETAILED DESCRIPTION OF THE INVENTION

The following description provides specific details of preferred embodiments of the present invention in order to provide the reader with a thorough understanding of the present invention. The skilled artisan, however, will understand that the present invention may be practiced without employing these specific details. Indeed, the present invention can be practiced in conjunction with fabrication techniques conventionally used in the industry.

The process steps and structures described below do not form a complete process flow for fabricating semiconductor devices or for fabricating a completed device. Only the processes and structures that are necessary to provide one of ordinary skill in the art with an understanding of the present invention are described herein.

Figure 7:
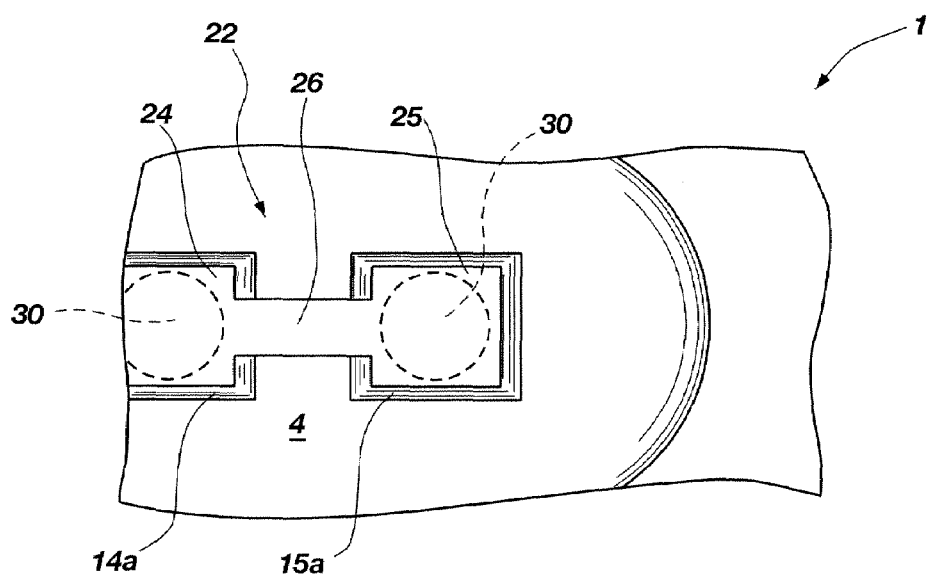
FIG. 7 is a top view of a fuse fabricated by the process depicted in FIGS. 1-6.
Figure 8:
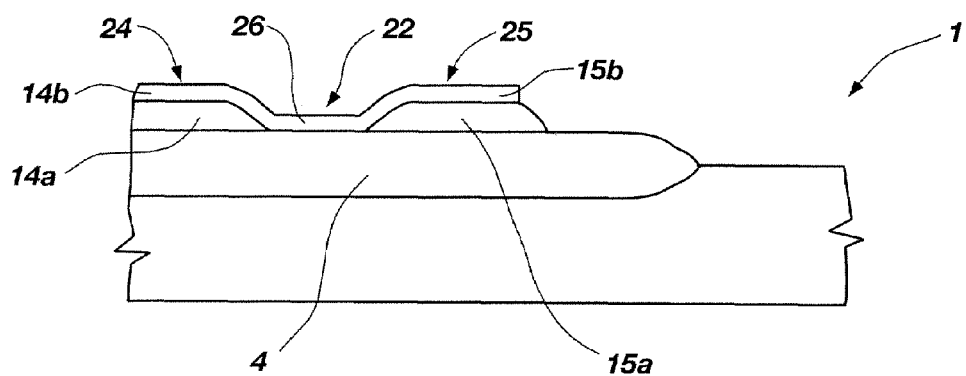
FIG. 8 is a cross-sectional representation of the fuse depicted in FIG. 7.

FIGS. 7 and 8 illustrate an exemplary embodiment of a fuse 22 according to the present invention. Terminal regions 24 and 25, or terminals, of fuse 22 each include a lower, first conductive layer 14a and 15a, respectively, and an upper, second conductive layer 14b and 15b, respectively. Terminal regions 24 and 25 are configured to accommodate conductive contacts 30 of a type known in the art, which facilitate the flow of current across fuse 22.

A central region 26, or conductive link, of fuse 22 is positioned between terminal regions 24 and 25 and, in the depicted example, directly adjacent an insulative structure 4 or layer of semiconductor device structure 1. Central region 26 may have a lesser mass or volume of conductive material (e.g., is narrower in width) than terminal regions 24 and 25. As central region 26 has a lesser conductive material mass or volume than terminal regions 24 and 25, when fuse 22 is subjected to at least a programming electrical current, central region 26 will likely "blow" before terminal regions 24 or 25. Central region 26 will likely "blow" before terminal regions 24 and 25 because, while the same amount of current runs through both terminal regions 24 and 25 and central region 26 of fuse 22, there is less mass or volume of conductive material in central region 26 than at each of terminal regions 24 and 25. Consequently, the temperature in central region 26 increases at a faster rate than the temperature in terminal regions 24 and 25, leading to quicker agglomeration, melting, or otherwise induced discontinuity of fuse 22 in central region 26. Moreover, if central region 26 of fuse 22 is disposed directly adjacent an insulative structure or layer (e.g., insulative structure 4), as shown in FIGS. 7 and 8, or another structure that will prevent electrical current from flowing along the length of fuse 22, substantially no electrical current will be conducted between terminal region 24 and terminal region 25, across central region 26 of fuse 22 once central region 26 of fuse 22 is "blown" or otherwise rendered discontinuous.

FIGS. 1-8 illustrate an exemplary embodiment of a method for fabricating a fuse 22 (FIGS. 7 and 8) upon a semiconductor device structure. Fuse 22 may be fabricated substantially simultaneously with the fabrication of a gate structure of a field effect transistor and may be integrated into the process of fabricating such a gate structure. It will be understood by those skilled in the art that other fuses may also be formed by slight modifications of the method described in reference to FIGS. 1-8.

Figure 1:
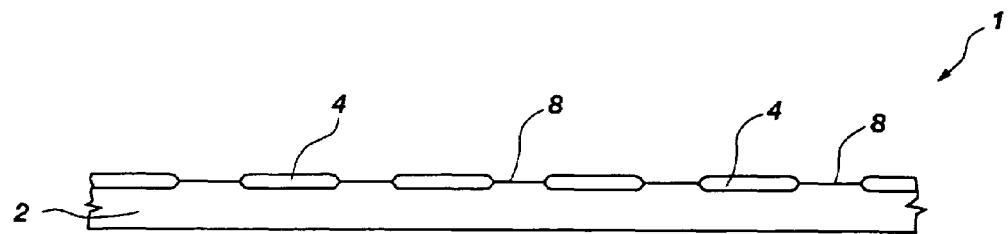
FIGS. 1-6 are cross-sectional schematic representations of an exemplary embodiment of a process for fabricating a fuse that includes terminals with first and second conductive layers and a less massive central region with a single conductive layer; of these.
Figure 2:
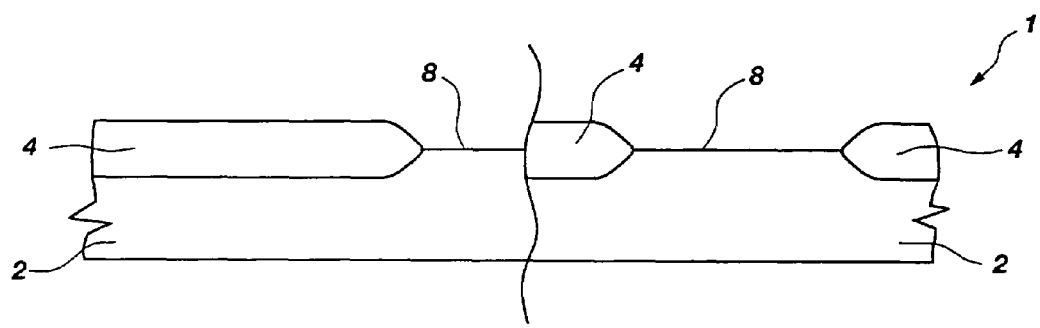

As shown in FIGS. 1 and 2, a semiconductor device structure 1 is provided upon which a fuse is to be fabricated. Semiconductor device structure 1 may include a substrate 2 comprising a full or partial semiconductor wafer (e.g., silicon, gallium arsenide, or indium phosphide) or bulk semiconductor region of a substrate, such as a so-called silicon-on-insulator ("SOI") structure (e.g., silicon-on-glass ("SOG"), silicon-on-ceramic ("SOC"), silicon-on-sapphire ("SOS"), etc.). By way of example only, substrate 2 may comprise a silicon wafer that has been lightly doped with a p-type dopant.

An insulative structure 4, such as a field oxide structure or other type of isolation structure, may be formed on or extending at least partially into a surface of substrate 2 by any suitable process known in the art. While insulative structures 4 are depicted as being so-called "LOCOS" (i.e., LOCal Oxidation of Silicon) structures, insulative structures 4 may alternatively comprise so-called "shallow trench isolation" (STI) structures or other known types of insulative structures. Insulative structure 4 may comprise a silicon oxide, a silicon nitride, a silicon oxynitride, or another suitable electrically insulative material, which may be formed or deposited at the surface of substrate 2, as known in the art.

Regions of substrate 2 that are exposed through insulative structure 4 are referred to as active regions 8. Various structures of a semiconductor device, such as diffusion regions (e.g., the active-device regions, or source and drain regions of a transistor) and conductive elements (e.g., the gate of a transistor), may be fabricated within or upon active regions 8. Conductive elements, gate structures and other structures may be fabricated over insulative structures 4 and active regions 8.

Figure 3:
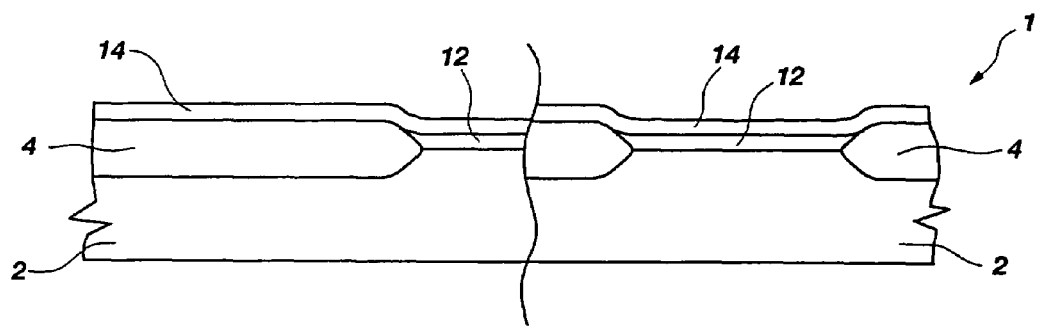

As depicted in FIG. 3, a layer 12 of dielectric material may be disposed over substrate 2 and, optionally, over insulative structure 4. Any dielectric material that may be employed as a gate dielectric, such as a silicon oxide, a silicon nitride, a silicon oxynitride, an organic dielectric material, another suitable dielectric material, or any combination of these materials, may be used to form layer 12. By way of example, layer 12 may be fabricated by known tetraethylorthosilicate ("TEOS") deposition processes. Layer 12 may be formed substantially over the exposed, active regions 8 of substrate 2. Layer 12 may also extend at least partially over insulative structure 4 (e.g., if layer 12 is deposited).

A layer 14 of conductive material, such as conductively doped polysilicon, is disposed over layer 12 of dielectric material and over insulative structure 4, as is known in the art. For example, if the conductive material of layer 14 comprises doped polysilicon, layer 14 may be formed by chemical vapor deposition of polysilicon, then conductively doped with any suitable dopant and by any suitable ion implantation process known in the art. Alternatively, the polysilicon of layer 14 can be in situ-doped during deposition, as known in the art, by including a gas containing the desired dopant in the deposition atmosphere.

Figure 4:
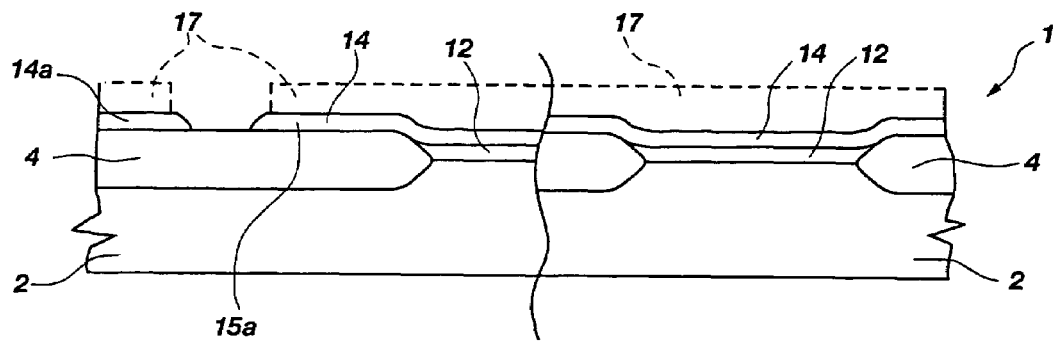
Figure 4A:
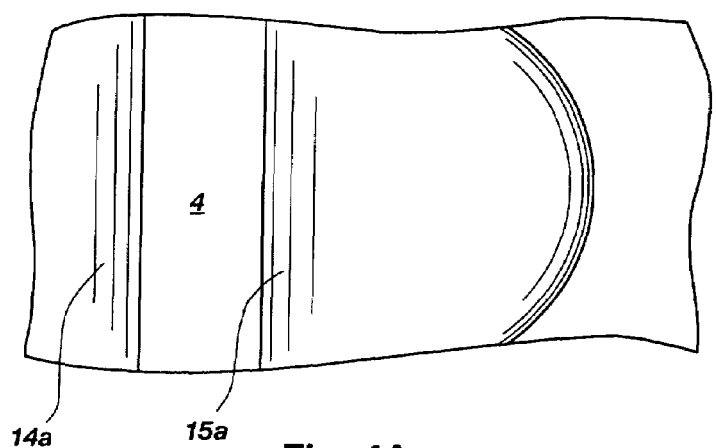
FIGS. 4B, 4C, 5B, and 6B depict a variation of the embodiment shown in and described with reference to FIGS. 1-6.

As shown in FIGS. 4 and 4A, layer 14 may be patterned to form laterally discrete, spaced-apart regions. For example, layer 14 may be patterned so as to begin forming fuses 22 (FIGS. 7 and 8) adjacent insulative structure 4. Any suitable method known in the art may be used to pattern layer 14. For example, layer 14 may be patterned by disposing or forming a mask 17 (e.g., a photomask) thereover and patterning layer 14 through the mask 17. In an exemplary patterning process, a layer of photoresist is disposed over layer 14, exposed and developed, and unpolymerized portions thereof removed to define a mask 17 (shown by the dotted line) adjacent layer 14. The regions of layer 14 that are exposed through mask 17 may be removed by known processes, such as by using any suitable etching process and etchant or combination of etchants that will remove the material or materials of layer 14 to expose a portion of underlying layer 12 or insulative structure 4 without substantially affecting the same or a gate dielectric which is formed at substantially the same fabrication level as layer 12. An isotropic etchant may be employed to remove the exposed portions of layer 14 to define first conductive layers 14a and 15a of terminals 24 and 25, respectively.

Mask 17 may then be removed by known processes.

Figure 5:
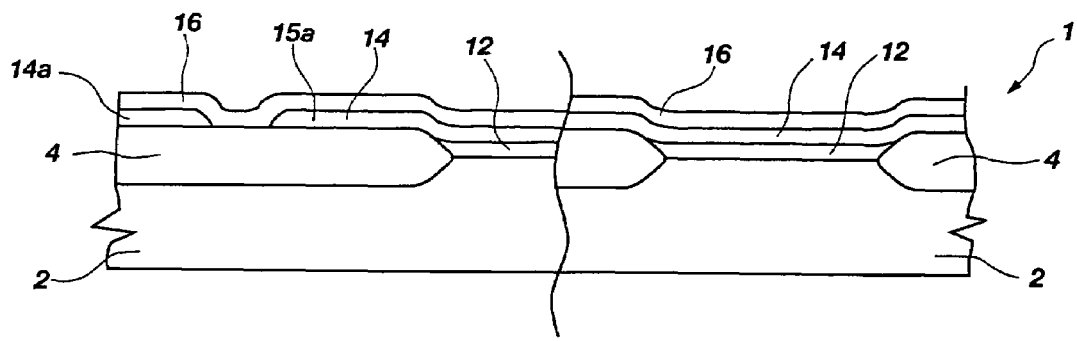

Referring now to FIG. 5, a layer 16 of a conductive material, such as a metal silicide (e.g., tungsten silicide or titanium silicide), an alloy of a metal and a conductive metal nitride (e.g., tungsten-tungsten nitride (W-WN)), a metal (e.g., tantalum (Ta)), conductively doped polysilicon, or a polysilicide, or polycide may be disposed over first conductive layers 14a and 15a of terminals 24 and 25 (FIG. 8), respectively, as well as over the other structures or layers that are exposed at the surface of semiconductor device structure 1. Layer 16 may comprise any conductive material known in the art. The conductive material of layer 16 preferably has both a lower resistance and a lower melting point than the material or materials of layers 14a and 15a.

Layer 16 may be formed by any suitable, known process. For example, when tungsten silicide is employed as layer 16, the tungsten silicide may be disposed upon the semiconductor device by any process known in the art to yield the desired physical and chemical characteristics, such as chemical vapor deposition ("CVD") or physical vapor deposition ("PVD") (e.g., cosputtering). An exemplary tungsten silicide deposition process that may be employed in the method of the present invention is disclosed in U.S. Pat. No. 5,231,056, which issued to Gurtej S. Sandhu on Jul. 27, 1993, the disclosure of which is hereby incorporated herein in its entirety by this reference. If titanium silicide is employed as the metal silicide of layer 16, known titanium silicide deposition processes, such as those disclosed in U.S. Pat. Nos. 5,240,739, 5,278,100, and 5,376,405, each of which issued to Trung T. Doan et al. on Aug. 31, 1993, Jan. 11, 1994, and Dec. 27, 1994, respectively, the disclosures of each of which are hereby incorporated herein in their entireties by this reference, may be used. As another example, a layer of metal may be disposed adjacent a layer or structure comprising silicon or polysilicon. The metal may then be annealed, by known processes, to the adjacent silicon or polysilicon to form layer 16.

Figure 6B:
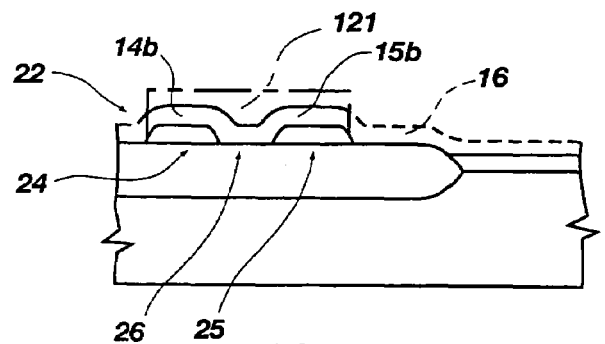
Figure 6:
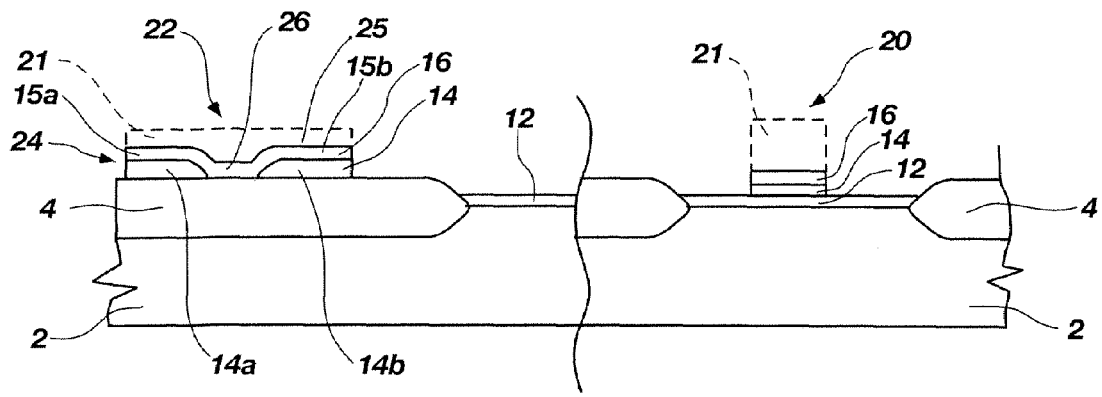

As depicted in FIG. 6, layer 16 and remaining portions of layer 14 may be patterned by any suitable process known in the art to define fuse 22 and, optionally, the conductive gate stack of a transistor gate 20. The respective portions of transistor gate 20 and fuse 22 may be defined from layers 16 and 14 at substantially the same time or at different times. While patterning layers 16 and 14 and, more specifically, while defining portions of fuse 22 therefrom, regions of layer 16 may be configured as second conductive layers 14b and 15b of terminals 24 and 25, respectively. A portion of layer 16 disposed laterally between the remaining portions of layer 14 is patterned to form a central region 26 of fuse 22. Central region 26 may be narrower in width or be otherwise of reduced cross-sectional area, taken transverse to the length thereof, and, thus, have a lesser material mass or volume than either of terminal regions 24 and 25.

Portions of layer 14 that overlie insulative structure 4 may then be patterned in the same or a separate process to define first conductive layers 14a and 15a that correspond to respective terminal regions 24 and 25 of fuse 22. Upon removing selected regions of layer 14, portions of the underlying structures, such as insulative structure 4 or layer 12 of dielectric material from which a gate dielectric is to be subsequently defined, are exposed.

Known processes, such as the disposal of a mask 21 over layer 16 and the removal of portions of layer 16 that are exposed through mask 21, may be employed to pattern layers 16 and 14. For example, mask 21 may be disposed adjacent layer 16 by disposing a quantity of a photoresist material adjacent layer 16 (e.g., by spin-on processes) and by exposing and developing selected regions of the photoresist material. The portions of layer 16 that are exposed through mask 21 may be removed by any suitable etching process and with any etchant or etchants suitable for removing the materials of layers 16 and 14 to define the respective portions of fuse 22 and, optionally, transistor gate 20 therefrom. If patterning of layers 16 and 14 without disrupting any structures or layers that underlie either of these layers 16 and 14 is desired, an etchant or etchant mixture may be used which removes material of one or both of layers 16 and 14 with selectivity over the material or materials of the underlying structures or layers. While anisotropic etchants and etching processes are currently preferably used to pattern layer 16, any known, suitable etchants and processes may be used.

Once fuse 22 and the stacked dielectric and conductive portions of transistor gate 20 have been fabricated, further processing of the desired semiconductor device may proceed. For example, diffusion regions, such as source and drain regions of a transistor, may be formed by implanting selected regions of substrate 2, preferably those regions adjacent each side of transistor gate 20, with a desired dopant. Contacts 30 (see FIG. 7) may also be fabricated in communication with terminal regions 24 and 25 of fuse 22, as well as above the source and drain regions of substrate 2, by known processes. Other structures or layers may also be fabricated on semiconductor device structure 1, as known in the art.

A method for using fuse 22 is described with reference again to FIGS. 7 and 8. An electrical current is applied across fuse 22 through contacts 30 or other conductive elements that communicate with terminals 24 and 25 of fuse 22. Since terminals 24 and 25 each include two layers 14a, 14b and 15a, 15b, respectively, that comprise conductive material, terminals 24 and 25 have greater conductive material masses and volumes than the single-layered central region 26 of fuse 22. Upon application of an electrical current, such as the programming current appropriate for fuse 22, the current density will be much greater in central region 26 than at terminals 24 and 25. Consequently, upon application of an electrical current to fuse 22, the temperature of central region 26 increases more quickly than the temperature of either terminal 24 or 25. Thus, central region 26 of fuse 22 will likely become discontinuous, or "blow," before terminals 24 and 25. As central region 26 becomes discontinuous, current flow across fuse 22 is interrupted.

Figure 4B:
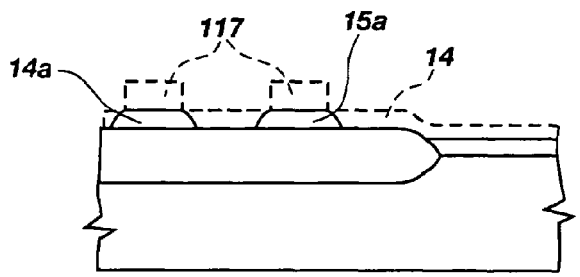
Figure 4C:
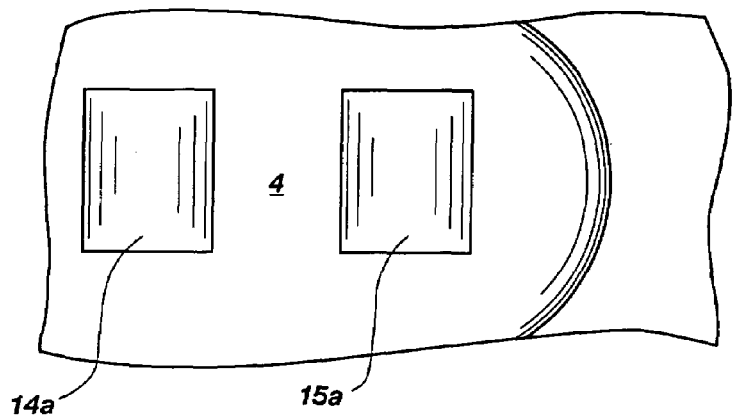

In a variation of this method, as depicted in FIGS. 4B, 4C, layer 14 may be patterned to form at least first conductive layers 14a and 15a of terminals 24 and 25, respectively, therefrom prior to the formation of layer 16 over the remaining portions of layer 14. This process may be effected, by way of example only, by forming a photomask 117 over layer 14 so as to shield first conductive layers 14a and 15a of terminals 24 and 25, respectively (FIGS. 6B, 7, and 8), from an etchant that will remove desired regions of layer 14. First conductive layers 14a and 15a that are formed in this way are laterally discrete and spaced apart from one another.

Figure 5B:
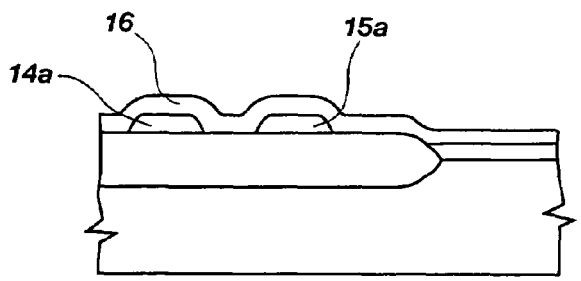

Once laterally discrete, spaced-apart first conductive layers 14a and 15a have been formed from layer 14, layer 16 may be formed thereover, as shown in FIG. 5B. Layer 16 may then be patterned (e.g., by exposure to an etchant suitable for removing the material of layer 16), as depicted in FIG. 6B and described with reference to FIG. 6, through a mask 121 (e.g., a photomask) to define the remaining portions of fuse 22, including upper conductive layers 14b and 15b of terminals 24 and 25, respectively, and central region 26 thereof.

FIGS. 9-14 depict another embodiment of a method for fabricating a fuse 22' (FIGS. 13 and 14) in accordance with teachings of the present invention.

Figure 9:
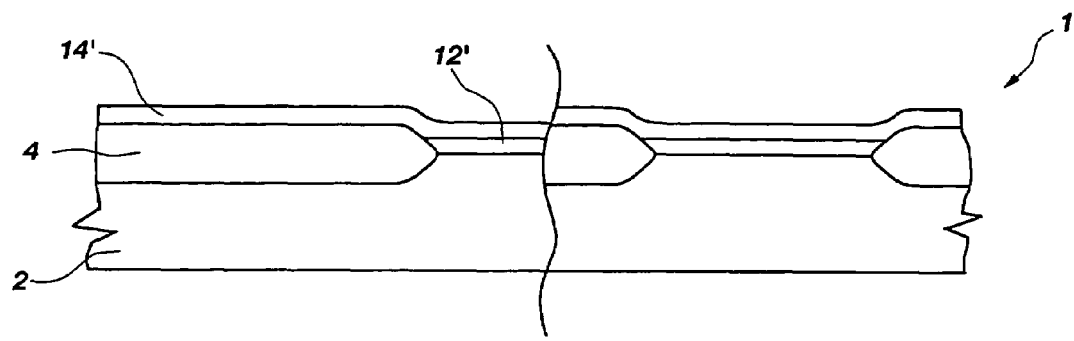
FIGS. 9-12 are cross-sectional schematic representations of a semiconductor device structure, depicting another exemplary embodiment of a process for fabricating a fuse in accordance with the teachings of the present invention.

Once a semiconductor device structure 1, such as that depicted in FIGS. 1 and 2, has been provided, a layer 12' of dielectric material may be formed over exposed regions of a substrate 2 and insulative structures 4, such as isolation regions, of semiconductor device structure 1, as shown in FIG. 9.

As is also illustrated in FIG. 9, a layer 14' that includes conductive material is formed over an exposed surface of semiconductor device structure 1. It is currently preferred that layer 14' include polysilicon and a conductivity dopant, which may be either an N-type conductivity dopant or a P-type conductivity dopant. When layer 14' includes conductively doped polysilicon, known processes for depositing conductively doped polysilicon may be used to form layer 14'. For example, layer 14' may be formed by depositing polysilicon over semiconductor device structure 1, then implanting the deposited layer 14' of polysilicon with a suitable N-type or P-type conductivity dopant, as known in the art. Alternatively, layer 14' may be formed by in situ doping of, or introduction of dopant into the polysilicon as it is deposited (e.g., by cosputtering or concurrent chemical vapor deposition (CVD)), polysilicon and a suitable N-type or P-type conductivity dopant.

Figure 10:
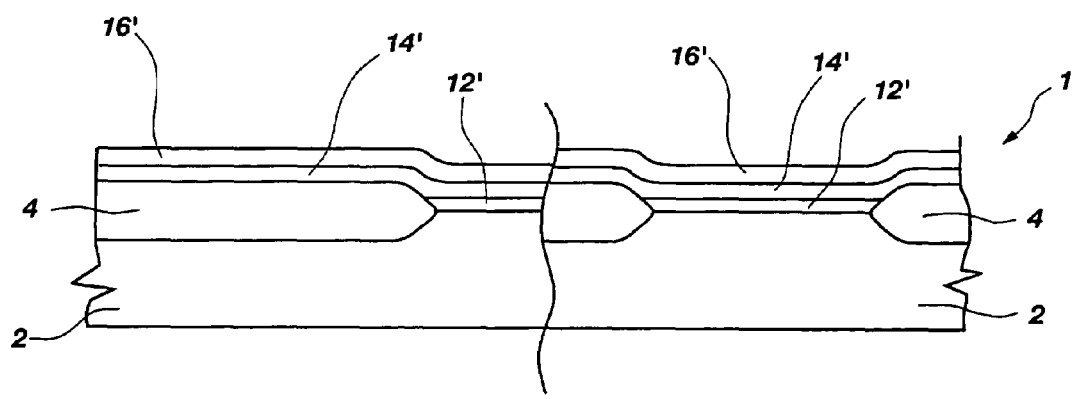

As depicted in FIG. 10, once layer 14' has been formed from a suitable conductive material, another layer 16' which also comprises a conductive material is formed over layer 14'. The conductive material of layer 16' may include, but is not limited to, a metal silicide (e.g., tungsten silicide or titanium silicide), an alloy of a metal and a conductive metal nitride (e.g., tungsten-tungsten nitride (W-WN)), a metal (e.g., tantalum (Ta)), conductively doped polysilicon, and a polysilicide, or polycide. A metal silicide layer 16' may be formed as described previously herein with reference to FIG. 5. When metal or a conductive alloy is used to form layer 16', the metal or conductive alloy may be formed by known processes, including, without limitation, known physical vapor deposition (PVD) (e.g., sputtering) and CVD techniques. Subsequently, a metal silicide or polycide may be formed, as known in the art, by annealing the metal or conductive alloy and material of layer 14'.

Figure 11A:
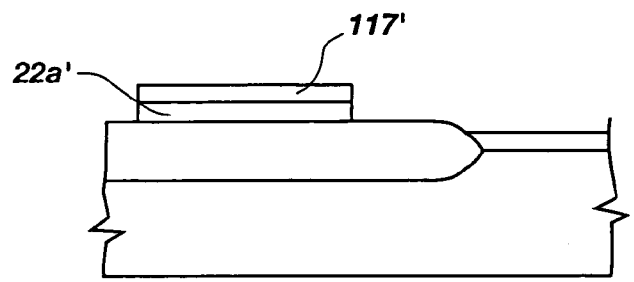
Figure 11:
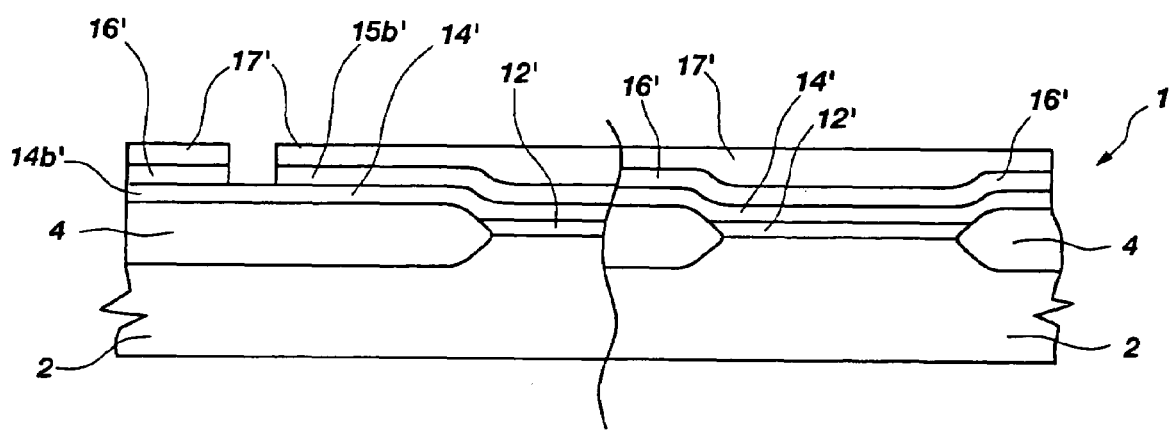

Turning now to FIG. 11, known processes may be used to pattern layer 16', removing at least some material thereof from above areas where a conductive link 26' of each fuse 22' is to be located. For example and as illustrated, a mask 17', such as a photomask, may be formed over layer 16'. As shown, mask 17' shields regions of layer 16', including regions 14b' and 15b' of layer 16', which will form upper layers of respective spaced-apart terminals 24' and 25', but does not shield regions of layer 14' over the area where a conductive link 26' (FIG. 13) is to be formed from exposure to etchants. Layer 16' may be patterned through mask 17', as known in the art, such as by use of wet etch or dry etch techniques. Patterning of layer 16' through mask 17' results in the definition of discrete, spaced-apart regions 14b' and 15b' of conductive material, which comprise upper layers of finished terminals 24' and 25' (FIGS. 13 and 14), respectively. An etchant or etchant system that etches the material or materials of layer 16' with selectivity over the material or materials of layer 14' may be employed. In the event that a gate stack is to be patterned through the same mask as fuse 22', the regions of layers 16' and 14' from which the gate stack is to be formed remain shielded by mask 17'.

Figure 12A:
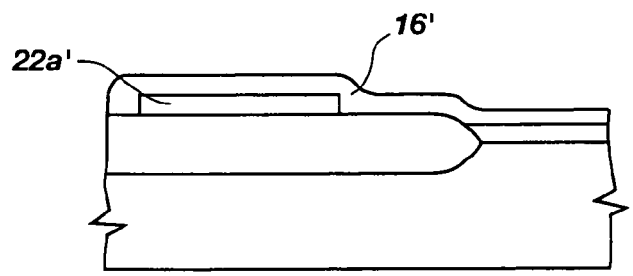
Figure 12B:
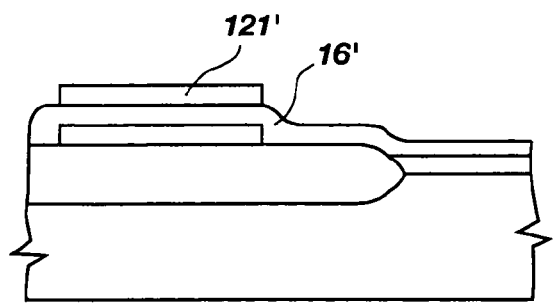
Figure 12:
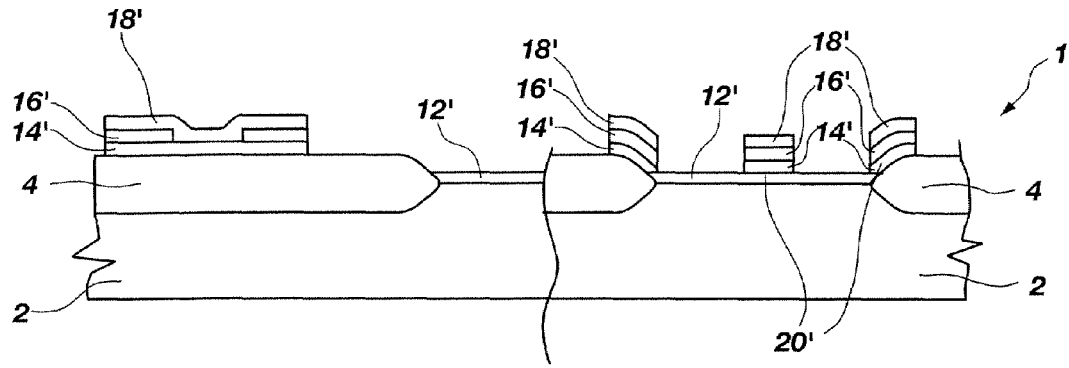
Figure 13:
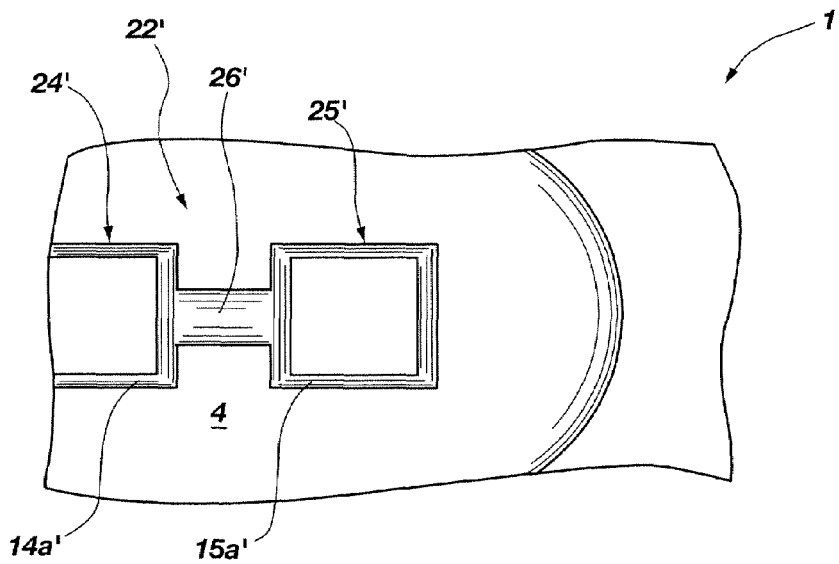
FIG. 13 is a top view of a fuse fabricated by the methods shown in FIGS. 9-12.
Figure 14:
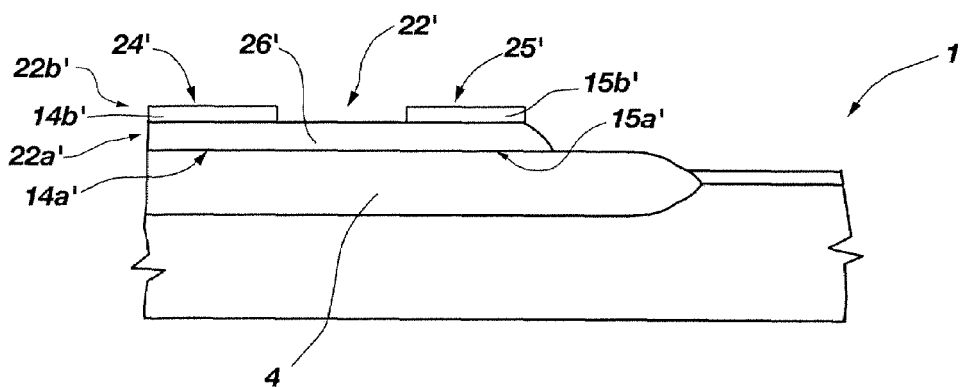
FIG. 14 is a cross-sectional representation of the fuse of FIG. 13.

Following the patterning of layer 16' to form laterally discrete, spaced-apart regions 14b' and 15b' therefrom, layers 16' and 14' may be patterned, as shown in FIG. 12, to define the remaining features of fuse 22'. Of course, one or more intervening process steps, such as transistor gate fabrication process steps, may be effected before layer 14' is patterned. In patterning layers 16' and 14', a mask 18' may be formed over regions of the semiconductor device structure 1 and, in particular, over regions of layers 16' and 14' that are to be shielded from material removal processes. Mask 18' is formed so as to shield regions of layers 14' and 16' from which terminals 24' and 25' are to be formed from exposure to etchants, as well as the region of layer 14' that will form a conductive link 26', or central region, of fuse 22', which connects terminals 24' and 25'. Regions of layers 16' and, subsequently, 14' are then exposed to one or more etchants or combination(s) of etchants through mask 18' and, thus, removed from semiconductor device structure 1. As a result, terminals 24' and 25' and conductive link 26' therebetween are formed, as illustrated in FIGS. 13 and 14. Mask 18' may also be used to pattern a gate stack 20' from layers 16' and 14'.

As an alternative to the process order depicted in FIGS. 10 and 11, the order in which these mask and etch processes are conducted may be reversed. Stated another way, layers 16' and 14' and may be patterned through mask 18' to form the outer periphery of fuse 22' and, optionally, the conductive layers of a gate stack, as shown in FIG. 11, before layer 16' is patterned through mask 17' to form laterally discrete, spaced-apart regions 14b' and 15b' therefrom, as illustrated in FIG. 10.

Figure 10A:
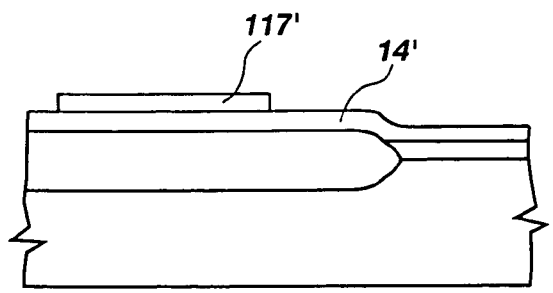
FIGS. 10A, 11A, 12A, and 12B illustrate a variation of the method shown in and described with respect to FIGS. 9-12.

As another variation of this method, FIGS. 10A, 11A, 12A, and 12B depict patterning of layer 14' prior to the formation of layer 16' thereover. FIG. 10A shows a mask 117', such as a photomask, over regions of layer 14' that are to be shielded from an etchant which is suitable for removing the material of layer 14'. In FIG. 11A, material which was exposed through mask 117' has been removed to form a lower layer 22a' of a fuse 22' (FIGS. 13 and 14).

As can be seen in FIG. 12A, mask 117' has also been removed so that layer 16' may be disposed over and physically contact lower layer 22a'. Next, as shown in FIG. 12B, another mask 121', such as a photomask, is formed over layer 16' to exposed selected regions thereof. When layer 16' has been exposed through mask 121' to an etchant (not shown) suitable for removing the material of layer 16' through mask 121', an upper layer 22b' (FIG. 14) of fuse 22' (FIGS. 13 and 14) is formed therefrom. As shown in FIG. 14, upper layer 22b' includes laterally discrete, spaced apart, upper conductive layers 14b' and 15b' of terminals 24' and 25', respectively.

Of course, as is well known and may be readily determined by those of ordinary skill in the art, the relative dimensions of each region of fuse 22, 22', the material or materials of fuse 22, 22', the dimensions of terminals 24, 24' and 25, 25', as well as the respective layers 14a, 14b; 14a', 14b' and 15a, 15b; 15a', 15b' and other factors dictate the amount of curr required to cause central region 26, 26' to "blow" or otherwise become discontinuous before either of terminals 24, 24' or 25, 25' "blows" or becomes discontinuous. With current no longer flowing across fuse 22, 22', an open circuit is created.

Further enhancements could be made to the above-disclosed method. For example, the fuse of the present invention could be fabricated either independently or concurrently with the fabrication of semiconductor devices other than a transistor gate.

Having thus described in detail preferred embodiments of the present invention, it is to be understood that the invention defined by the appended claims is not to be limited by particular details set forth in the above description, as many apparent variations thereof are possible without departing from the spirit or scope thereof.

What is claimed is:

1. A method for fabricating a fuse and another structure of a semiconductor device structure, comprising:
   forming a dielectric layer over a semiconductor substrate;
   forming a first layer comprising a first conductive material over the semiconductor substrate;
   forming a second layer comprising a second conductive material over the first layer;
   defining discrete, spaced-apart terminal regions of the fuse from the second layer; and
   after defining the discrete, spaced-apart terminal regions, patterning the second layer and the first layer substantially concurrently to define at least an outer periphery of the fuse and of the another structure.

2. The method of claim 1, wherein patterning comprises patterning the first and second layers so as to form the fuse and a conductive element of a transistor gate.

3. The method of claim 1, wherein patterning comprises patterning the first layer so as to form portions of spaced-apart terminals of the fuse and a conductive link connecting portions of the spaced-apart terminals.

4. The method of claim 3, wherein patterning comprises patterning the first and second layers so as to form additional portions of the spaced-apart terminals without forming a portion of the conductive link.

5. The method of claim 1, wherein forming the first layer comprises depositing polysilicon over the semiconductor substrate.

6. The method of claim 5, wherein forming the second layer comprises forming a layer comprising at least one of a metal silicide, a polycide, a metal, and a conductive alloy.

7. The method of claim 1, wherein forming the second layer comprises forming the second layer having substantially no contact resistance with the first layer.

8. A method for forming a fuse, comprising:
   forming a layer comprising polysilicon;
   forming another layer comprising conductive material in contact with the layer comprising polysilicon;
   removing conductive material of the another layer that contacts the layer from a region to be located over a conductive link of the fuse; and
   after removing the conductive material, removing material of the layer and the another layer substantially concurrently to define the conductive link and terminals positioned at different sides of the conductive link.

9. The method of claim 8, wherein forming the another layer comprises forming the another layer to include a metal.

10. The method of claim 8, wherein forming the another layer comprises forming the another layer to include a metal silicide.

11. The method of claim 10, wherein forming the another layer comprises depositing the metal silicide.

12. The method of claim 10, wherein forming the another layer comprises:
   depositing a layer comprising metal; and
   annealing metal of the layer comprising metal to polysilicon of the layer comprising polysilicon.

\* \* \* \* \*